(12) United States Patent
Tanaka et al.

(10) Patent No.: US 11,867,167 B2
(45) Date of Patent: Jan. 9, 2024

(54) PIEZOELECTRIC PUMP WITH ANNULAR VALVE ARRANGEMENT

(71) Applicant: Murata Manufacturing Co., Ltd., Kyoto (JP)

(72) Inventors: Nobuhira Tanaka, Kyoto (JP); Masaaki Fujisaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 390 days.

(21) Appl. No.: 17/369,289

(22) Filed: Jul. 7, 2021

(65) Prior Publication Data

US 2021/0332812 A1    Oct. 28, 2021

Related U.S. Application Data

(63) Continuation of application No. PCT/JP2020/000272, filed on Jan. 8, 2020.

(30) Foreign Application Priority Data

Mar. 27, 2019    (JP) .................... 2019-061034

(51) Int. Cl.
*F04B 43/04*    (2006.01)
*H10N 30/20*    (2023.01)
(Continued)

(52) U.S. Cl.
CPC .......... *F04B 43/046* (2013.01); *F04B 45/041* (2013.01); *H10N 30/2047* (2023.02); *F04B 45/047* (2013.01)

(58) Field of Classification Search
CPC .... F04B 43/046; F04B 45/041; F04B 45/047; F04B 53/10; H01N 30/2047
See application file for complete search history.

(56) References Cited

U.S. PATENT DOCUMENTS 10,697,450 B2 *    6/2020    Tanaka ................... F04B 19/22
10,788,034 B2 *    9/2020    Ganti .................... F04B 45/043
(Continued)

FOREIGN PATENT DOCUMENTS

JP    2009-074418 A    4/2009
JP    2009-156454 A    7/2009
(Continued)

OTHER PUBLICATIONS

International Search Report for International Patent Application No. PCT/JP2020/000272 dated Mar. 3, 2020.
(Continued)

*Primary Examiner* — Nathan C Zollinger
(74) *Attorney, Agent, or Firm* — Pearne & Gordon LLP

(57) ABSTRACT

A piezoelectric pump includes a first top plate, a second top plate, a diaphragm, a first side wall, and a second side wall. The diaphragm has a vibrating part to which a piezoelectric element is attached, a frame part, and a connecting part. The connecting part has formed therein a third opening which lets a first pump chamber and a second pump chamber communicate. The frame part has formed therein a fourth opening which communicates with the third opening and also communicates with outside. The piezoelectric pump further includes: in the first pump chamber, an annular first valve provided as spaced from a first opening in a planar view so as to surround the first opening; and in the second pump chamber, an annular second valve provided as spaced from a second opening in the planar view so as to surround the second opening.

20 Claims, 15 Drawing Sheets

(51) Int. Cl.
  *F04B 45/04*    (2006.01)
  *F04B 45/047*   (2006.01)

(56) References Cited

U.S. PATENT DOCUMENTS

| | | |
|---|---|---|
| 11,391,277 B2 *  | 7/2022  | Tanaka .................. F04B 45/047 |
| 11,441,555 B2 *  | 9/2022  | Tanaka .................. F04B 45/047 |
| 2010/0074775 A1* | 3/2010  | Yamamoto ............ F04B 43/046 |
|                  |         | 417/413.2 |
| 2010/0215522 A1  | 8/2010  | Kawamura et al. |
| 2015/0023821 A1  | 1/2015  | Campbell et al. |
| 2017/0218949 A1  | 8/2017  | Yokoi et al. |
| 2020/0370544 A1* | 11/2020 | Tanaka .................. F04B 17/003 |
| 2021/0010467 A1  | 1/2021  | Fujisaki et al. |
| 2021/0048013 A1  | 2/2021  | Tanaka et al. |
| 2021/0324844 A1* | 10/2021 | Tanaka .................. F04B 45/047 |

FOREIGN PATENT DOCUMENTS

| | | |
|---|---|---|
| JP | 2010-223218 A  | 10/2010 |
| JP | 2019-039436 A  | 3/2019  |
| WO | 2016/013390 A1 | 1/2016  |
| WO | 2019/230159 A1 | 12/2019 |
| WO | 2019/230160 A1 | 12/2019 |

OTHER PUBLICATIONS

Written Opinion for International Patent Application No. PCT/JP2020/000272 dated Mar. 3, 2020.

* cited by examiner

PIEZOELECTRIC PUMP WITH ANNULAR VALVE ARRANGEMENT

CROSS REFERENCE TO RELATED APPLICATIONS

This is a continuation of International Application No. PCT/JP2020/000272 filed on Jan. 8, 2020 which claims priority from Japanese Patent Application No. 2019-061034 filed on Mar. 27, 2019. The contents of these applications are incorporated herein by reference in their entireties.

BACKGROUND OF THE DISCLOSURE

Field of the Disclosure

The present disclosure relates to piezoelectric pumps.

Description of the Related Art

Conventionally, a piezoelectric pump using a piezoelectric element has been disclosed (for example, refer to Patent Document 1).

The piezoelectric pump of Patent Document 1 has a diaphragm to which a piezoelectric element is affixed, a first top plate and a second top plate arranged to be opposed to both main surfaces of the diaphragm, and a first side wall and a second side wall. The first side wall couples the diaphragm and the first top plate together, and the second side wall couples the diaphragm and the second top plate together. A space surrounded by the first top plate, the diaphragm, and the first side wall is a first pump chamber, and a space surrounded by the second top plate, the diaphragm, and the second side wall is a second pump chamber. The pump chambers are divided by the diaphragm.

The first top plate is provided with an inlet port and an exhaust port, and the second top plate is provided also with an inlet port and an exhaust port. Each of the exhaust ports is formed of a plurality of openings, and is selectively opened and closed by a film-shaped valve provided in the pump chamber.

In this structure, with alternating current power supplied to the piezoelectric element, bending deformation in unimorph mode occurs, and a change in pressure occurs in the inner spaces of the first pump chamber and the second pump chamber. In accordance with the change in pressure, the valve provided to the pump chamber moves alternately between a position where the exhaust port is opened and a position where the exhaust port is closed.

Patent Document 1: U.S. Patent Application Publication No. 2015/0023821

BRIEF SUMMARY OF THE DISCLOSURE

The valve which opens and closes the exhaust port repeatedly collides with the edge of the exhaust port. With the valve repeatedly colliding with the edge of the exhaust port, the valve may be damaged to decrease the function as a valve. As a result, reliability of the piezoelectric pump may be degraded.

Therefore, an object of the present disclosure is to solve the above-described problem and to provide a piezoelectric pump with improved reliability.

To achieve the above object, a piezoelectric pump according to the present disclosure includes: a first top plate having a first opening formed therein; a second top plate arranged as spaced from the first top plate and having a second opening formed therein; a diaphragm arranged between the first top plate and the second top plate and to which a piezoelectric element is attached; a first side wall coupling the first top plate and the diaphragm together and forming a first pump chamber between the first top plate and the diaphragm; and a second side wall coupling the second top plate and the diaphragm together and forming a second pump chamber between the second top plate and the diaphragm. The diaphragm has a vibrating part to which the piezoelectric element is attached, a frame part enclosed between the first side wall and the second side wall, and a connecting part connecting the vibrating part and the frame part. The connecting part has formed therein a third opening which lets the first pump chamber and the second pump chamber communicate. The frame part has formed therein a fourth opening which communicates with the third opening and also communicates with outside. The piezoelectric pump further includes: in the first pump chamber, an annular first valve provided as spaced from the first opening in a planar view so as to surround the first opening; and in the second pump chamber, an annular second valve provided as spaced from the second opening in the planar view so as to surround the second opening.

According to the piezoelectric pump of the present disclosure, reliability can be improved.

DETAILED DESCRIPTION OF THE DISCLOSURE

Figure 1:
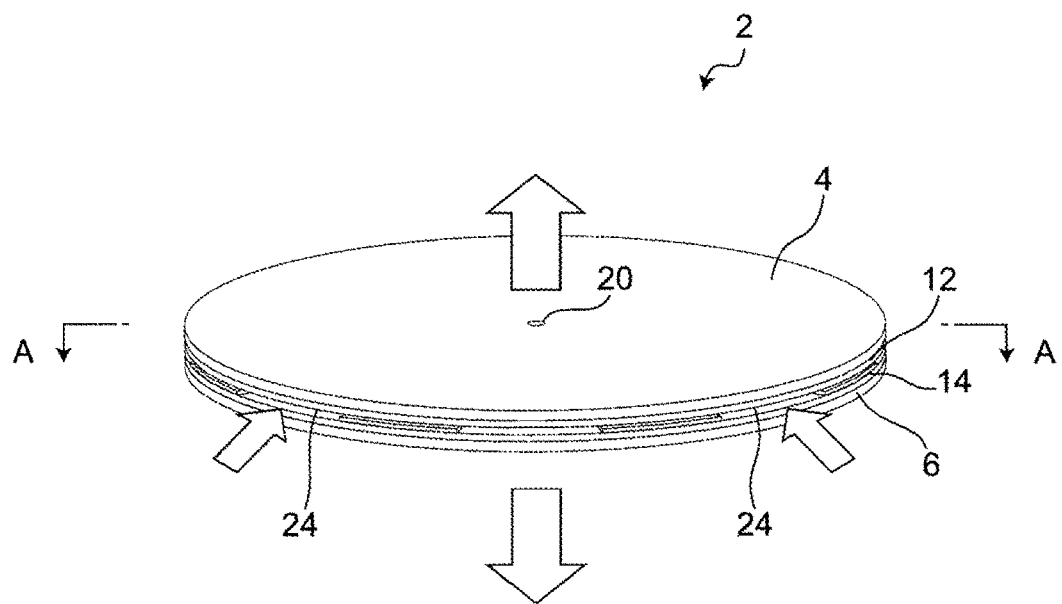
FIG. 1 is a perspective view of a piezoelectric pump in a first embodiment.

According to a first mode of the present disclosure, there is provided a piezoelectric pump including: a first top plate having a first opening formed therein; a second top plate arranged as spaced from the first top plate and having a second opening formed therein; a diaphragm arranged between the first top plate and the second top plate and to which a piezoelectric element is attached; a first side wall coupling the first top plate and the diaphragm together and forming a first pump chamber between the first top plate and the diaphragm; and a second side wall coupling the second top plate and the diaphragm together and forming a second pump chamber between the second top plate and the diaphragm. The diaphragm has a vibrating part to which the piezoelectric element is attached, a frame part enclosed between the first side wall and the second side wall, and a connecting part connecting the vibrating part and the frame part. The connecting part has formed therein a third opening which lets the first pump chamber and the second pump chamber communicate. The frame part has formed therein a fourth opening which communicates with the third opening and also communicates with outside. The piezoelectric pump further includes: in the first pump chamber, an annular first valve provided as spaced from the first opening in a planar view so as to surround the first opening; and in the second pump chamber, an annular second valve provided as spaced from the second opening in the planar view so as to surround the second opening.

According to this structure, since the first valve and the second valve are respectively arranged away from the first opening and the second opening, the first valve and the second valve are designed not to collide with the edges of the openings, suppressing the damages on the valves. This can extend the life of the valves and improve the reliability of the piezoelectric pump.

According to a second mode of the present disclosure, there is provided the piezoelectric pump according to the first mode, in which the first valve includes a first fixed part fixed to the first top plate and a first movable part extending from the first fixed part, and the second valve includes a second fixed part fixed to the second top plate and a second movable part extending from the second fixed part. According to this structure, with the valves fixed to the top plates, compared with a case in which each valve is fixed to the vibrating part, the vibration of the fixed part of the valve can be suppressed. This suppresses excessive vibration losses, can obtain a large vibration displacement, and can obtain a high flow rate and pressure characteristics.

According to a third mode of the present disclosure, there is provided the piezoelectric pump according to the first mode, in which the first valve includes a first fixed part fixed to the vibrating part and a first movable part extending from the first fixed part, and the second valve includes a second fixed part fixed to the vibrating part and a second movable part extending from the second fixed part. According to this structure, with the valves fixed to the vibrating part, flow-path resistance near the top plates can be reduced, and a high flow rate can be obtained.

According to a fourth mode of the present disclosure, there is provided the piezoelectric pump according to the second or third mode, in which the first movable part of the first valve is arranged on an inner side portion of the first fixed part of the first valve in the planar view, and the second movable part of the second valve is arranged on an inner side portion of the second fixed part of the second valve in the planar view. According to this structure, a flow from the first opening or the second opening via the third opening toward the fourth opening can be suppressed, and a flow from the fourth opening via the third opening toward the first opening or the second opening can be promoted.

According to a fifth mode of the present disclosure, there is provided the piezoelectric pump according to the second or third mode, in which the first movable part of the first valve is arranged on an outer side portion of the first fixed part of the first valve in the planar view, and the second movable part of the second valve is arranged on an outer side portion of the second fixed part of the second valve in the planar view. According to this structure, a flow from the fourth opening via the third opening toward the first opening or the second opening can be suppressed, and a flow from the first opening or the second opening via the third opening toward the fourth opening can be promoted.

According to a sixth mode of the present disclosure, there is provided the piezoelectric pump according to any one of the first to fifth modes, in which the vibrating part has an outer circumferential edge arranged at a position shifted from a position serving as a vibration node of the vibrating part. According to this structure, with the outer circumferential edge of the vibrating part reliably vibrated, it is possible to suppress transfer of vibration by the piezoelectric element to the side walls and the top plates configuring the outline of the piezoelectric pump. In this manner, the leakage of the vibration can be decreased and displacement by the vibrating part can be increased.

According to a seventh mode of the present disclosure, there is provided the piezoelectric pump according to any one of the first to sixth modes, in which the vibrating part, the connecting part, and the frame part are integrally configured. According to this structure, the leakage of the vibration can be decreased.

According to an eighth mode of the present disclosure, there is provided the piezoelectric pump according to any one of the first to sixth modes, in which the vibrating part and the connecting part are configured of separate bodies, and the connecting part is configured of a material with an elastic modulus lower than the vibrating part. According to this structure, the leakage of the vibration can be decreased.

According to a ninth mode of the present disclosure, there is provided the piezoelectric pump according to the eighth mode, in which the connecting part is thinner than the vibrating part. According to this structure, the leakage of the vibration can be decreased.

According to a tenth mode of the present disclosure, there is provided the piezoelectric pump according to any one of the first to ninth modes, in which the connecting part has a first connecting part extending outward from the outer circumferential edge of the vibrating part, a second connecting part extending from the first connecting part along the outer circumferential edge of the vibrating part, and a third connecting part extending from the second connecting part so as to be connected to the frame part. According to this structure, the leakage of the vibration can be decreased.

In the following, embodiments according to the present disclosure are described in detail based on the drawings.

First Embodiment

Figure 2:
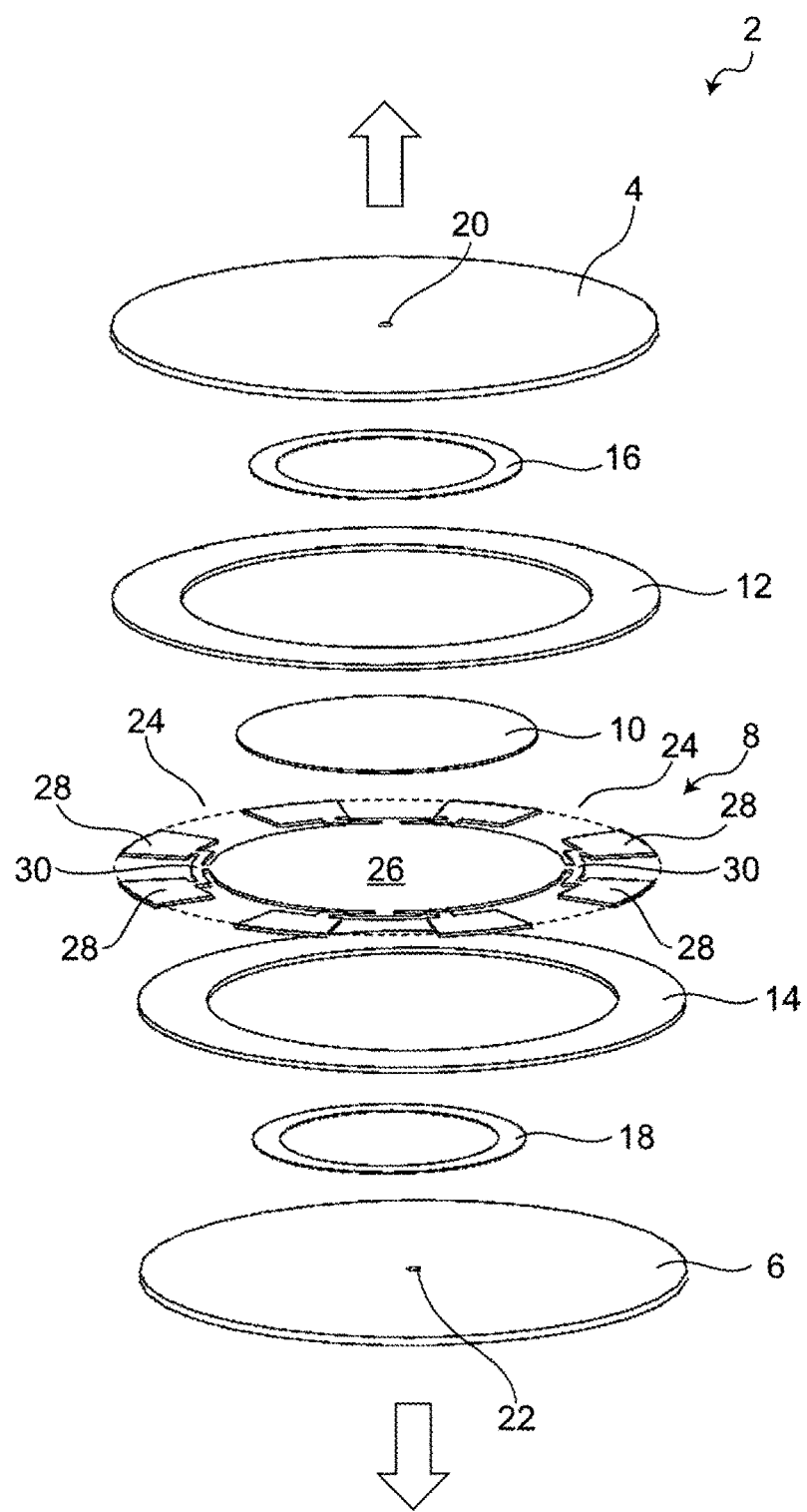
FIG. 2 is an exploded perspective view of the piezoelectric pump in the first embodiment.
Figure 3:
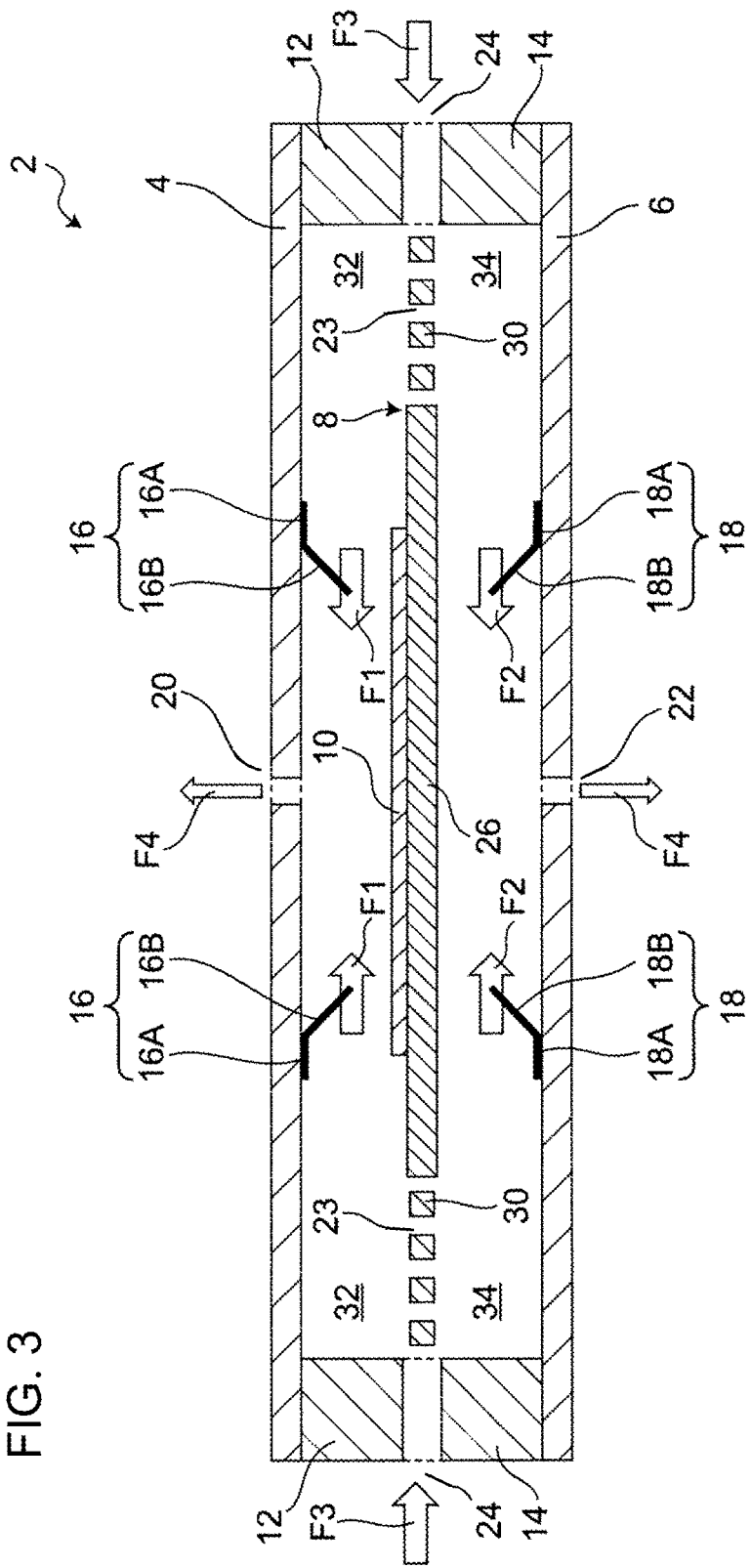
FIG. 3 is an A-A sectional view of FIG. 1.

FIG. 1 to FIG. 3 are diagrams each depicting schematic structure of a piezoelectric pump 2 in a first embodiment. FIG. 1 is a perspective view of the piezoelectric pump 2 in the first embodiment, FIG. 2 is an exploded perspective view of the piezoelectric pump 2, and FIG. 3 is a longitudinal sectional view (A-A sectional view of FIG. 1) of the piezoelectric pump 2.

The piezoelectric pump 2 is a pump device which transfers air by using a piezoelectric element 10 (FIG. 2 and FIG. 3) (the device may be referred to as a "microblower", "micropump", or the like). The piezoelectric pump 2 is a pump which, with the piezoelectric element 10 vibrated at high speeds, as depicted in FIG. 1 and FIG. 3, takes air in from a plurality of fourth openings 24, which are inlet ports, and discharges air from a first opening 20 and a second opening 22 (FIG. 2 and FIG. 3), which are exhaust ports. Each of FIG. 1 to FIG. 3 depicts an example in which the plurality of fourth openings 24 are provided on a side surface of the piezoelectric pump 2 and the first opening 20 and the second opening 22 are provided on a front surface and a back surface of the piezoelectric pump 2.

As depicted in FIG. 2 and FIG. 3, the piezoelectric pump 2 includes a first top plate 4, a second top plate 6, a diaphragm 8, the piezoelectric element 10, a first side wall 12, a second side wall 14, a first valve 16, and a second valve 18. The piezoelectric pump 2 has a structure with the piezoelectric element 10 laminated to the diaphragm 8. With alternating current power supplied to the piezoelectric element 10, bending deformation in unimorph mode is caused to occur. Inside the piezoelectric pump 2, the first valve 16 and the second valve 18, which function as valves, are incorporated.

The first top plate 4 and the second top plate 6 are members configuring the front surface and the back surface, respectively, of the piezoelectric pump 2. The first top plate 4 and the second top plate 6 are both disc-shaped members, and are arranged as spaced from each other. The first opening 20 is formed at a center part of the first top plate 4, and the second opening 22 is formed at a center part of the second top plate 6. On the first top plate 4 and the second top plate 6, no other opening is formed. The material of the first top plate 4 and the second top plate 6 is, for example, a metal such as stainless steel or aluminum or a resin such as polyphenylene sulfide (PPS).

The diaphragm 8 is a member arranged between the first top plate 4 and the second top plate 6. To the diaphragm 8, the piezoelectric element 10 is attached. On the outer circumferential part of the diaphragm 8, the plurality of fourth openings 24 are formed. The diaphragm 8 includes a vibrating part 26, frame parts 28, and connecting parts 30. The detailed structure of the diaphragm 8 will be described further below.

The first side wall 12 and the second side wall 14 are both members configuring the side wall of the piezoelectric pump 2. The first side wall 12 and the second side wall 14 are both annular members, each having a circular opening at a center part. The material of the first side wall 12 and the second side wall 14 is, for example, a metal or a resin.

As depicted in FIG. 3, the first side wall 12 couples the first top plate 4 and the diaphragm 8 together, and forms a first pump chamber 32 between the first top plate 4 and the diaphragm 8. The second side wall 14 couples the second top plate 6 and the diaphragm 8 together, and forms a second pump chamber 34 between the second top plate 6 and the diaphragm 8. The first pump chamber 32 and the second pump chamber 34 mutually communicate via third openings 23 depicted in FIG. 3. The third openings 23 are openings formed by the connecting part 30 of the diaphragm 8 described above.

The first valve 16 and the second valve 18 are valve members which control a flow of air inside the piezoelectric pump 2. The first valve 16 and the second valve 18 are both annular members, each having a circular opening at a center part. The first valve 16 is provided in the first pump chamber 32, and the second valve 18 is provided in the second pump chamber 34. The material of the first valve 16 and the second valve 18 is, for example, a resin such as polyimide, PET, or PPS.

As depicted in FIG. 3, the first valve 16 includes a fixed part 16A and a movable part 16B. The fixed part 16A is a portion fixed to the first top plate 4, and the movable part 16B is a movable portion extending from the fixed part 16A. The movable part 16B is not fixed to any member, and functions as a free end (open end).

As depicted in FIG. 3, the movable part 16B is provided to a center side closer to the first opening 20 than the fixed part 16A. With this arrangement, in the first pump chamber 32, a flow of air from the center toward an outer side portion is suppressed and an inverse flow F1 from the outer side portion toward the center is promoted.

The second valve 18 includes a fixed part 18A and a movable part 18B. Since the fixed part 18A and the movable part 18B have a similar structure as that of the fixed part 16A and the movable part 16B of the first valve 16 described above, detailed description is omitted. As depicted in FIG. 3, with the second valve 18 provided in the second pump chamber 34, in the second pump chamber 34, a flow of air from the center toward an outer side portion is suppressed and an inverse flow F2 from the outer side portion toward the center is promoted.

Figure 4A:
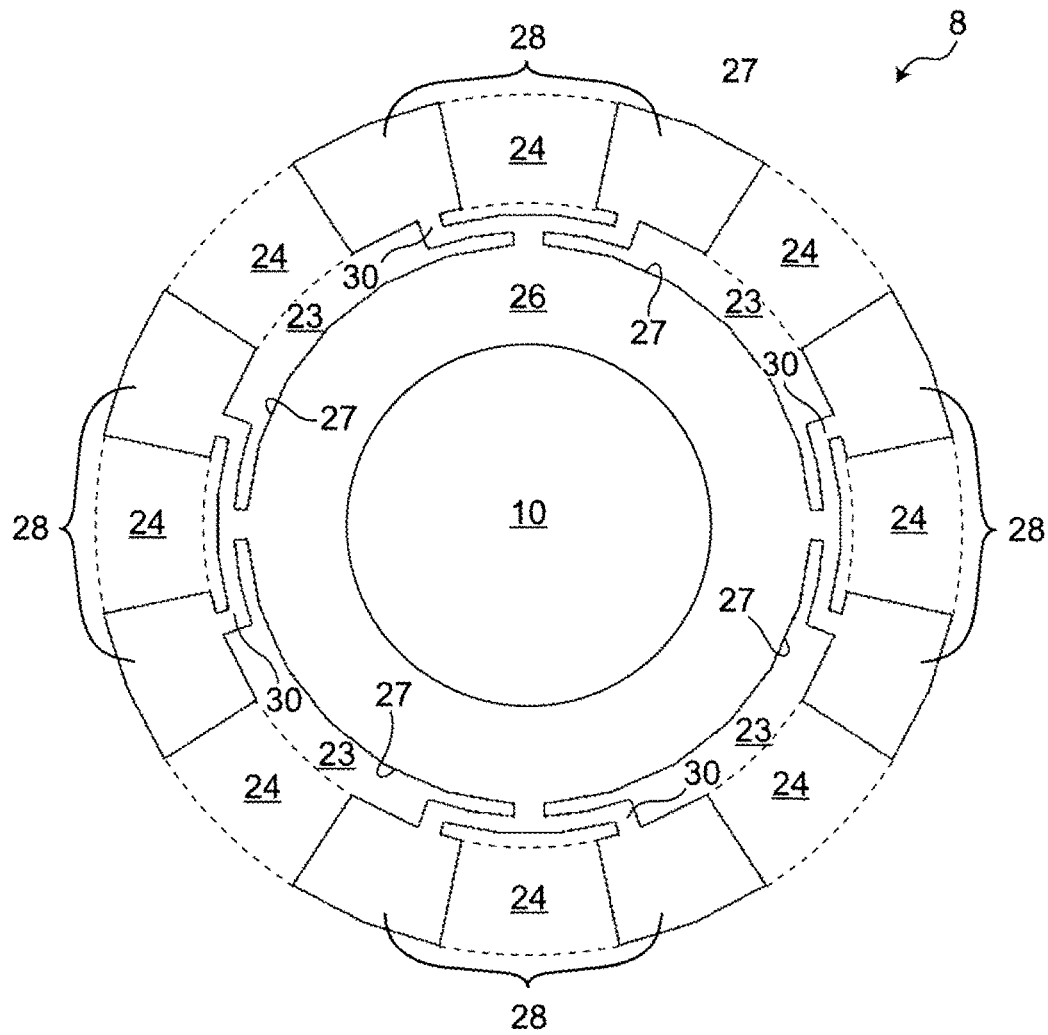
FIG. 4A is a plan view of a diaphragm in the first embodiment.
Figure 4B:
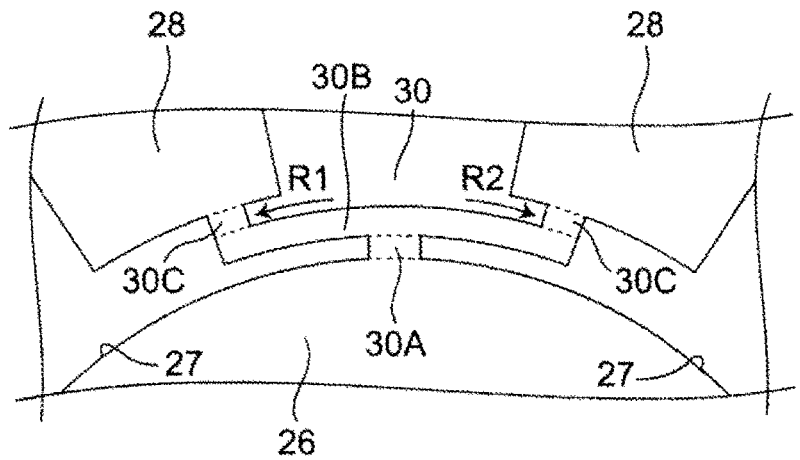
FIG. 4B is a partially enlarged view of FIG. 4A.

The structure of the diaphragm 8 is described by using FIG. 4A and FIG. 4B. FIG. 4A is a plan view of the diaphragm 8 with the piezoelectric element 10 attached thereto, and FIG. 4B is a partially enlarged view of FIG. 4A.

As depicted in FIG. 4A, the diaphragm 8 of the first embodiment has the vibrating part 26, the plurality of frame parts 28, and the plurality of connecting parts 30 integrally formed. The material of the diaphragm 8 is mainly, for example, a metal material such as stainless steel or aluminum. The entire or a part of the front surface of the diaphragm 8 may be coated with an insulating material such as polyimide.

The vibrating part 26 is a disc-shaped portion to which the piezoelectric element 10 is attached. The vibrating part 26 functions as a vibrating member which vibrates together with the piezoelectric element 10. The piezoelectric element 10 attached to the vibrating part 26 is arranged concentrically with the vibrating part 26.

The frame parts 28 are the outer circumferential portions of the diaphragm 8. The frame parts 28 are enclosed by the first side wall 12 and the second side wall 14 described above. The frame parts 28 configure the side wall of the piezoelectric pump 2, together with the first side wall 12 and the second side wall 14. As depicted in FIG. 4A, the frame parts 28 are provided as distributed at a plurality of locations, and the plurality of fourth openings 24 are each provided between the frame parts 28.

The connecting parts 30 are portions connecting the vibrating part 26 and the frame parts 28. The connecting parts 30 extend from an outer circumferential edge 27 of the vibrating part 26 toward an outer side portion to be connected to the frame parts 28. The connecting parts 30 function as a support part which supports the vibrating part 26. The connecting parts 30 are provided as distributed at a plurality of locations, and the plurality of third openings 23 are each provided between the connecting parts 30.

As depicted in FIG. 4A, the third openings 23 and the fourth openings 24 mutually communicate. As described by using FIG. 3, the third openings 23 are openings which let the first pump chamber 32 and the second pump chamber 34 mutually communicate, and the fourth openings 24 are openings which communicate with outside. According to this structure, the first pump chamber 32 and the second pump chamber 34 each communicate with outside via the third openings 23 and the fourth openings 24. This causes, in accordance with the flow F1 in the first pump chamber 32 and the flow F2 in the second pump chamber 34 being promoted, a flow F3 flowing from the fourth openings 24 via the third openings 23 to the inside of the piezoelectric pump 2 and a flow F4 flowing from the first opening 20 and the second opening 22 to the outside. In FIG. 3, as average flows inside the piezoelectric pump 2, arrow marks F1 to F4 are depicted.

Next, the detailed structure of each connecting part 30 is described by using FIG. 4B.

As depicted in FIG. 4B, the connecting part 30 has a first connecting part 30A, a second connecting part 30B, and a third connecting part 30C. The first connecting part 30A is a portion extending from an outer circumferential edge 27 of the vibrating part 26 to the outer side portion. The second connecting part 30B is a portion extending from the tip of the first connecting part 30A along the outer circumferential edge 27 of the vibrating part 26. The second connecting part 30B depicted in FIG. 4B has a component R1 toward one side and a component R2 toward the other side along the outer circumferential edge 27 of the vibrating part 26. The third connecting part 30C is a portion extending from the tip of the second connecting part 30B toward the frame part 28.

According to this structure, the connecting part 30 having the second connecting part 30B functions as a beam which supports the vibrating part 26. With the connecting part 30 caused to function as a beam, it is possible to provide the connecting part 30 with desired flexibility. Thus, when the vibrating part 26 vibrates, the transmission of the vibration of the vibrating part 26 via the connecting part 30 to the frame parts 28 is suppressed, thereby suppressing the leakage of the vibration of the piezoelectric element 10.

Figure 5A:
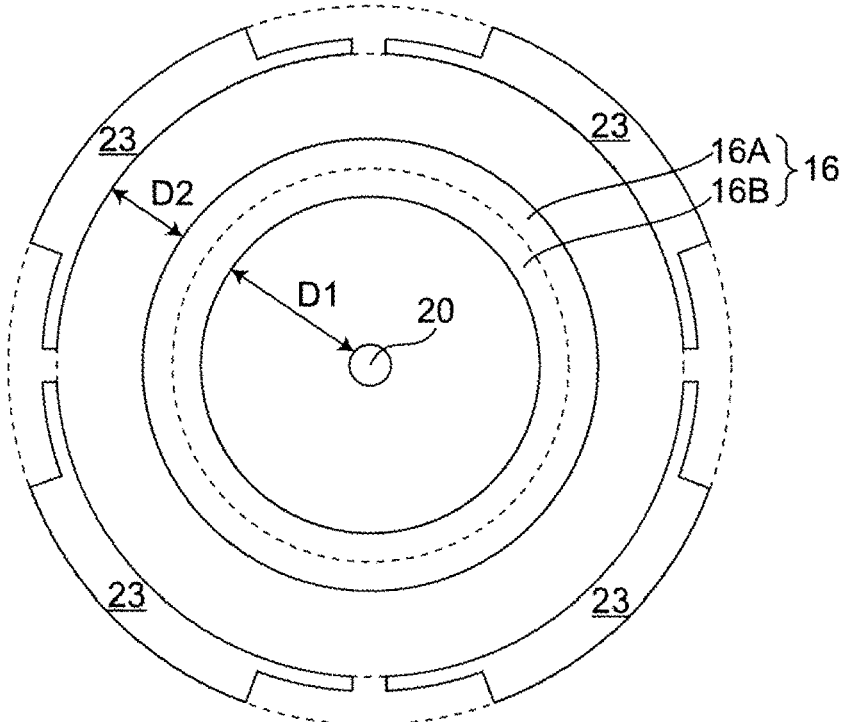
FIG. 5A is a diagram depicting a positional relation among a first opening, a first valve, and third openings when the piezoelectric pump in the first embodiment is viewed in a planar view.
Figure 5B:
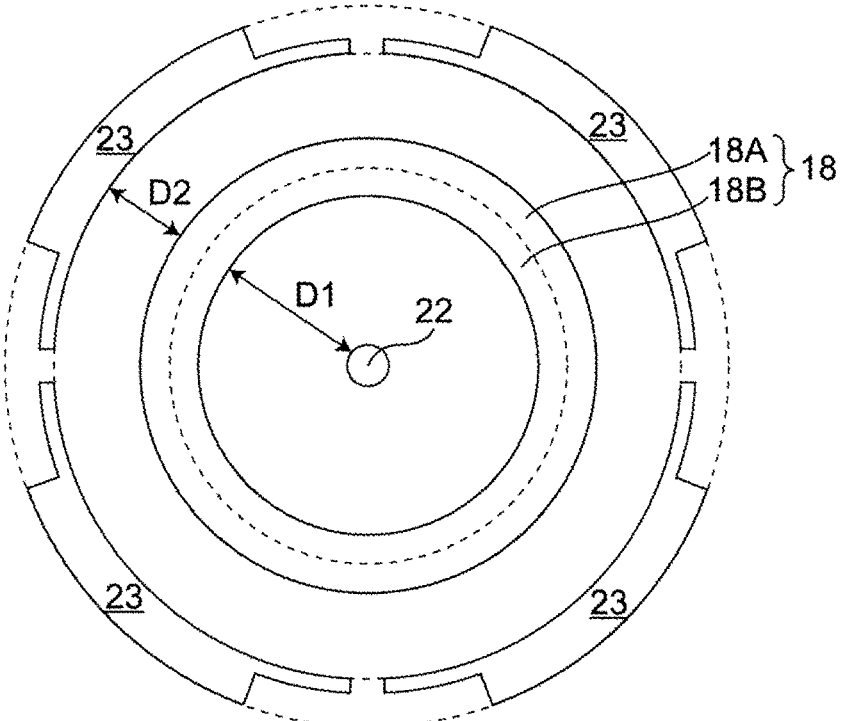
FIG. 5B is a diagram depicting a positional relation among a second opening, a second valve, and the third openings when the piezoelectric pump in the first embodiment is viewed in a planar view.

Next, a relation between the valves 16 and 18 and the openings 20 and 22 is described by using FIG. 5A and FIG. 5B. FIG. 5A is a plan view depicting a positional relation among the first opening 20, the first valve 16, and the third openings 23 when the piezoelectric pump 2 is viewed in a planar view. FIG. 5B is a plan view depicting a positional relation among the second opening 22, the second valve 18, and the third openings 23 when the piezoelectric pump 2 is viewed in a planar view.

As depicted in FIG. 5A, the first opening 20 is arranged at an inner side portion of the first valve 16 in a planar view, and the third openings 23 are arranged on an outer side portion of the first valve 16 in a planar view. The first valve 16 is annularly formed so as to surround the first opening 20 with a distance D1 from the first opening 20, and is provided also with a distance D2 from the third openings 23. According to this structure, since the first valve 16 is away from the first opening 20, even if the movable part 16B of the first valve 16 moves at high speeds when the piezoelectric pump 2 is driven, the movable part 16B does not collide with the edge of the first opening 20. In this manner, with the movable part 16B of the first valve 16 designed not to collide with the edge of the first opening 20, it is possible to suppress the damages on the first valve 16 and extend the life of the first valve 16. This can improve the reliability of the piezoelectric pump 2.

Similarly, as depicted in FIG. 5B, the second opening 22 is arranged at an inner side portion of the second valve 18 in a planar view, and the third openings 23 are arranged on an outer side portion of the second valve 18 in a planar view. The second valve 18 is annularly formed so as to surround the second opening 22 with the distance D1 from the second opening 22, and is provided also with the distance D2 from the third openings 23. According to this structure, as with the first valve 16, the movable part 18B of the second valve 18 can be designed not to collide with the edge of the second opening 22. This can suppress the damages on the second valve 18, extend the life of the second valve 18, and improve the reliability of the piezoelectric pump 2.

Figure 6:
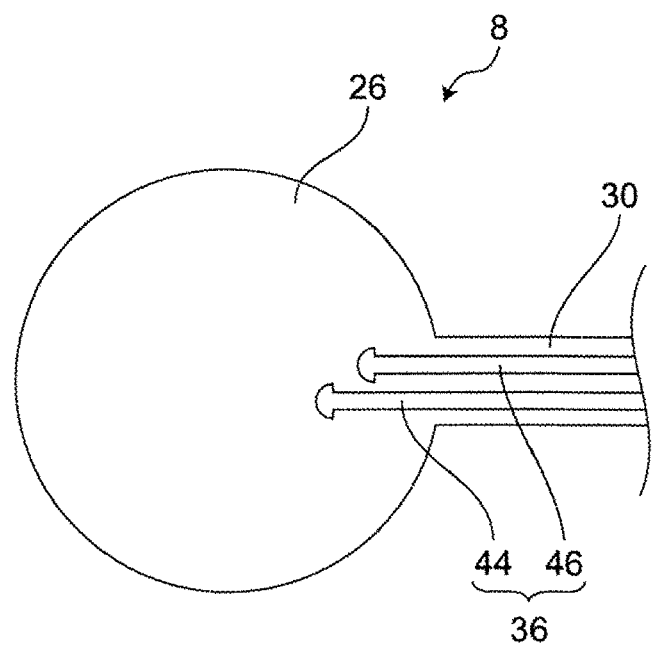
FIG. 6 is a plan view depicting a front surface of the diaphragm in the first embodiment.
Figure 7:
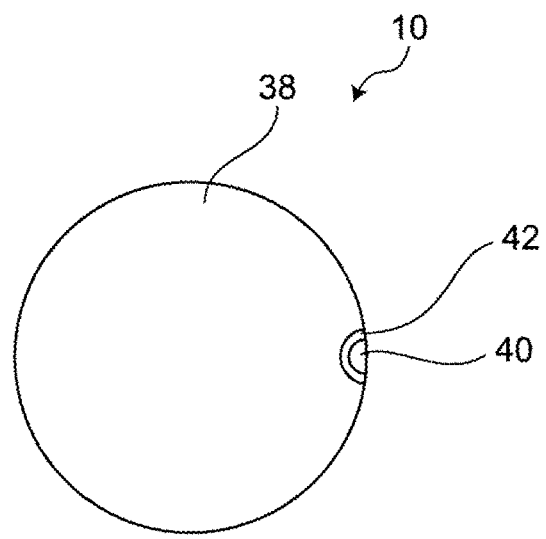
FIG. 7 is a plan view depicting a back surface of a piezoelectric element in the first embodiment.

Next, a wire 36 connected to the piezoelectric element 10 is described by using FIG. 6 and FIG. 7. FIG. 6 is a plan view depicting a front surface of the diaphragm 8 forming the wire 36, and FIG. 7 is a plan view depicting a back surface of the piezoelectric element 10.

As depicted in FIG. 6, on the front surface of the diaphragm 8, a first wire 44 and a second wire 46 are formed as the wire 36. Part of the front surface of the diaphragm 8 is coated with an insulating material, and the first wire 44 and the second wire 46 formed on the diaphragm 8 are electrically insulated. With the first wire 44 and the second wire 46 formed on the diaphragm 8 coated with the insulating material, the breakage risk can be reduced.

The first wire 44 and the second wire 46 are formed from the vibrating part 26 of the diaphragm 8 over the connecting part 30 and the frame parts 28, and are connected to a drive circuit (not depicted) provided outside the piezoelectric pump 2.

Although depiction is omitted, a portion where the first wire 44 and the second wire 46 make contact with the first side wall 12 and the second side wall 14 is coated with an insulating material, and is designed so as not to be energized together with the side walls 12 and 14.

As depicted in FIG. 7, on the back surface of the piezoelectric element 10, a first electrode 38 and a second electrode 40 are formed. An insulating area 42 is provided between the first electrode 38 and the second electrode 40, and the first electrode 38 and the second electrode 40 are electrically insulated. The first electrode 38 is formed on most of the back surface of the piezoelectric element 10, and the second electrode 40 is formed on a small portion of the back surface of the piezoelectric element 10. On the front surface (not depicted) of the piezoelectric element 10, the second electrode 40 is formed on the entire front surface. In FIG. 7, a portion of the second electrode 40 folded to the back surface side is depicted.

When the back surface of the piezoelectric element 10 depicted in FIG. 7 is mounted on the vibrating part 26 of the diaphragm 8 depicted in FIG. 6, while the first electrode 38 is brought into contact with the first wire 44, the second electrode 40 is brought into contact with the second wire 46. With the wires of two types, that is, the first wire 44 and the second wire 46, alternating current power can be supplied to the first electrode 38 and the second electrode 40, respectively, and can cause the piezoelectric element 10 to make a desired bending motion.

The operation of the piezoelectric pump 2 having the above-described structure is described by using FIG. 8A to FIG. 8D. FIG. 8A to FIG. 8D are longitudinal sectional views each depicting one state when the piezoelectric pump 2 is driven. In FIG. 8A to FIG. 8D, the depiction of the piezoelectric element 10 attached to the vibrating part 26 is omitted.

Figure 8A:
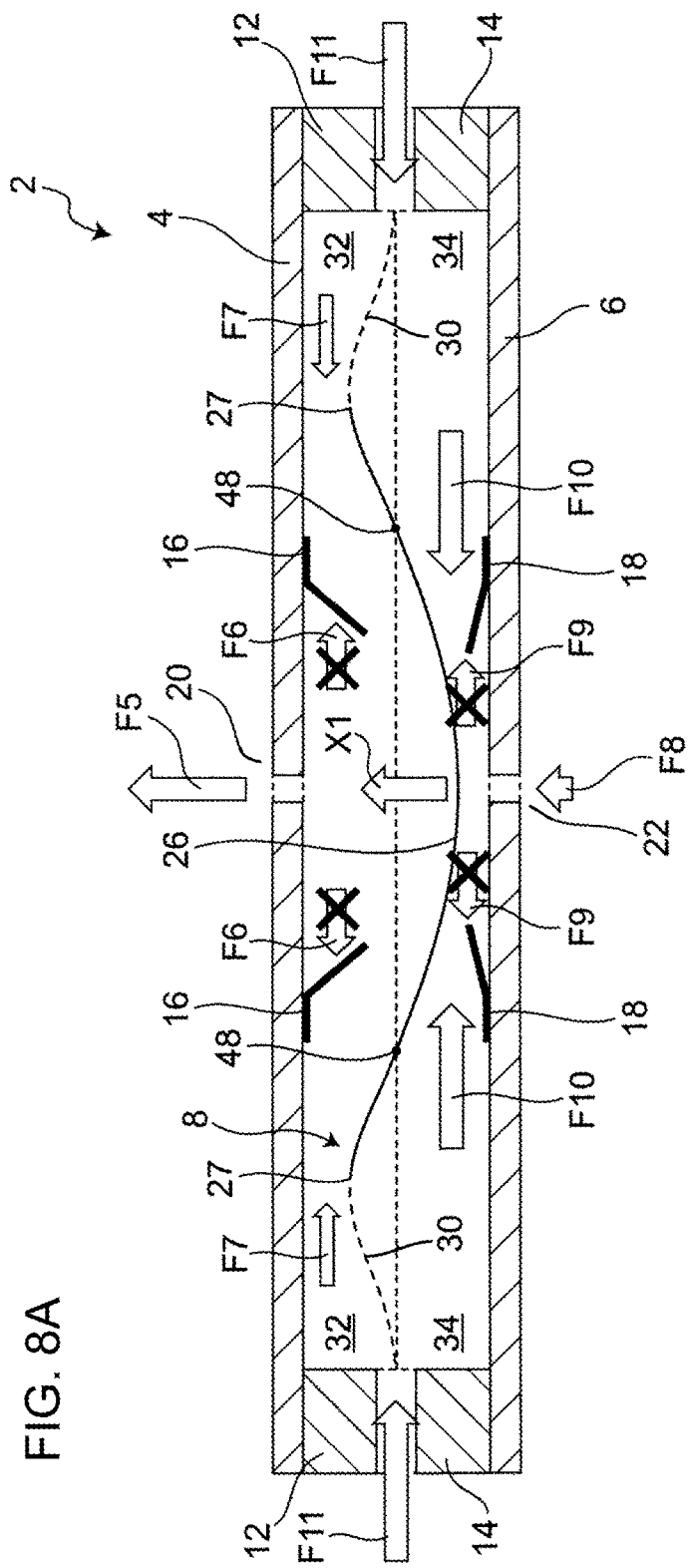
FIG. 8A is a sectional view depicting one state when the piezoelectric pump in the first embodiment is driven.
Figure 8B:
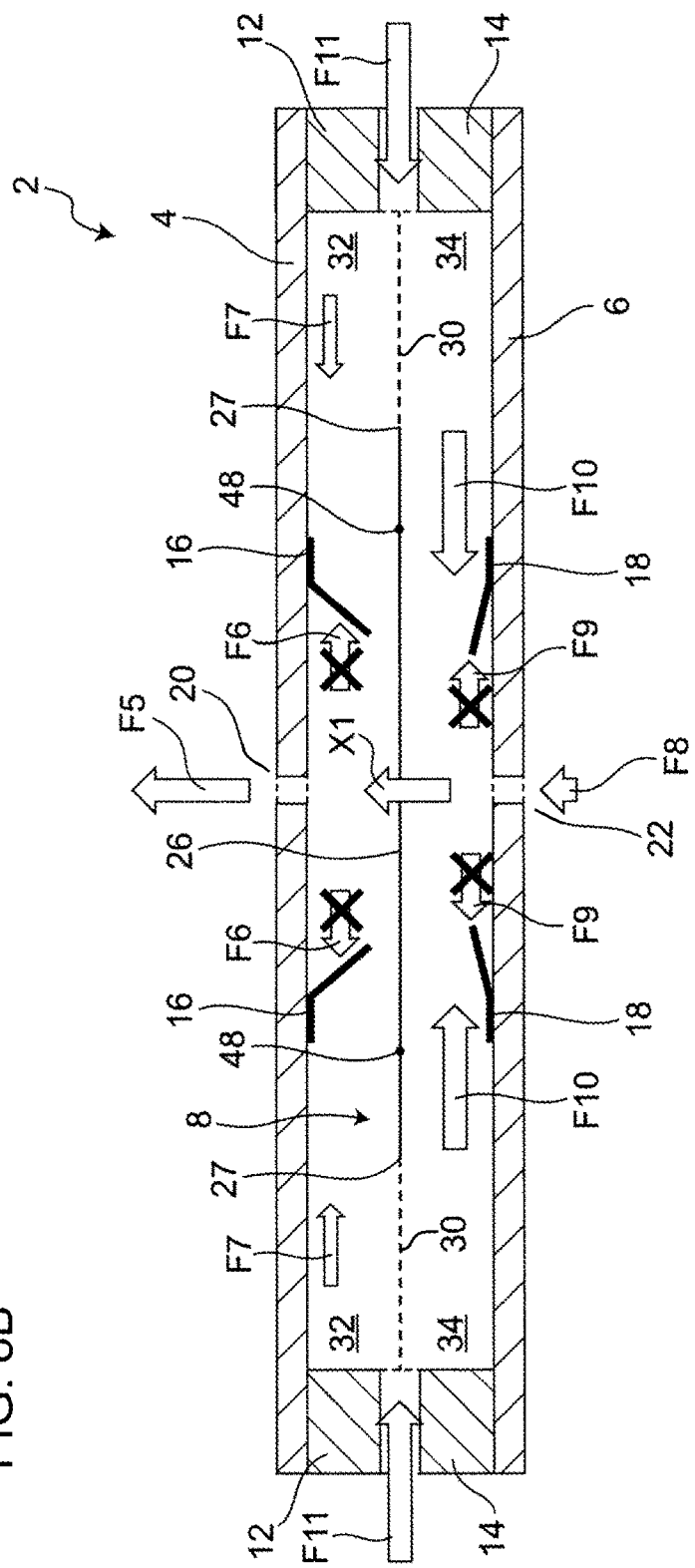
FIG. 8B is a sectional view depicting one state when the piezoelectric pump in the first embodiment is driven.

FIG. 8A depicts the state in which the center part of the diaphragm 8 is recessed most to a second top plate 6 side. FIG. 8B depicts the state in which, from the state depicted in FIG. 8A, the center part of the diaphragm 8 moves to a first top plate 4 side to become flat. As depicted in FIG. 8A and FIG. 8B, with the center part of the diaphragm 8 moving from the second top plate 6 side to the first top plate 4 side (arrow X1), air in the center part of the first pump chamber 32 is pushed toward the first top plate 4, causing a flow F5 to be discharged from the first opening 20. Here, a flow F6 of air in the center part of the first pump chamber 32 oriented to the outer side portion is suppressed by the first valve 16. On the other hand, the first valve 16 does not suppress an inverse flow F7 of air in the outer side portion of the first pump chamber 32 oriented to the center part.

In the second pump chamber 34, the space in the center part is widened upward to cause a negative pressure. This causes a flow F8 flowing from outside the piezoelectric pump 2 via the second opening 22 into the second pump chamber 34. Here, a flow F9 from the center part of the second pump chamber 34 toward the outer side portion is suppressed by the second valve 18. On the other hand, the second valve 18 does not suppress an inverse flow F10 of air in the outer side portion of the second pump chamber 34 oriented to the center part.

With the flows F7 and F10 respectively occurring in the first pump chamber 32 and the second pump chamber 34, a flow F11 flowing from the fourth openings 24 via the third openings 23 into the inside of the piezoelectric pump 2 is promoted.

Figure 8C:
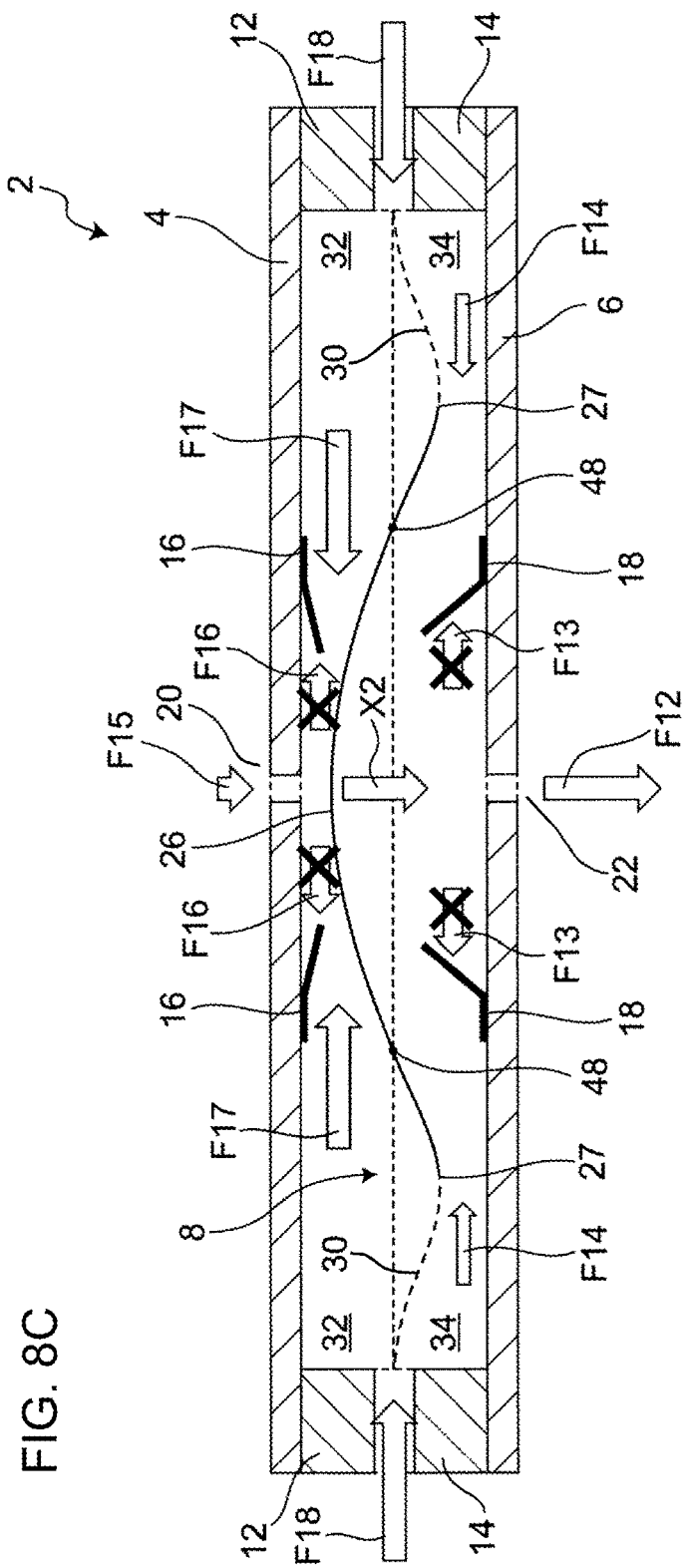
FIG. 8C is a sectional view depicting one state when the piezoelectric pump in the first embodiment is driven.
Figure 8D:
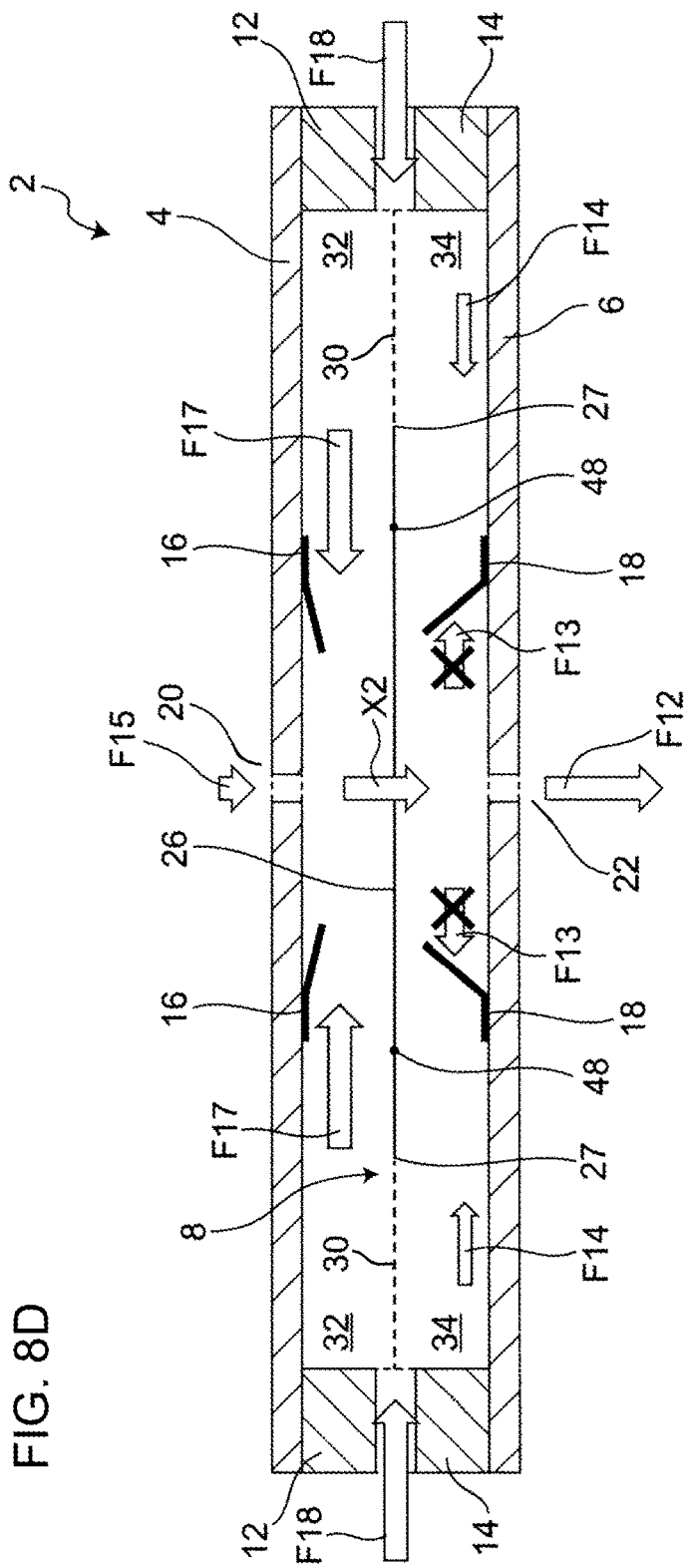
FIG. 8D is a sectional view depicting one state when the piezoelectric pump in the first embodiment is driven.

The states proceeding further from the state depicted in FIG. 8B are depicted in FIG. 8C and FIG. 8D. FIG. 8C depicts a state in which, from the state depicted in FIG. 8B, the center part of the diaphragm 8 moves most to the first top plate 4 side. FIG. 8D depicts a state in which, from the state depicted in FIG. 8C, the center part of the diaphragm 8 moves to the second top plate 6 side to become flat. As depicted in FIG. 8C and FIG. 8D, with the center part of the diaphragm 8 moving from the first top plate 4 side to the second top plate 6 side (arrow X2), air in the center part of the second pump chamber 34 is pushed toward the second top plate 6, causing a flow F12 to be discharged from the second opening 22. Here, a flow F13 of air in the center part of the second pump chamber 34 oriented to the outer side portion is suppressed by the second valve 18. On the other hand, the second valve 18 does not suppress an inverse flow F14 of air in the outer side portion of the second pump chamber 34 oriented to the center part.

In the first pump chamber 32, the space in the center part is widened downward to cause a negative pressure. This causes a flow F15 flowing from outside the piezoelectric pump 2 via the first opening 20 into the first pump chamber 32. Here, a flow F16 from the center part of the first pump chamber 32 toward the outer side portion is suppressed by the first valve 16. On the other hand, the first valve 16 does not suppress an inverse flow F17 of air in the outer side portion of the first pump chamber 32 oriented to the center part.

With the flows F17 and F14 respectively occurring in the first pump chamber 32 and the second pump chamber 34, a flow F18 flowing from the fourth openings 24 via the third openings 23 into the inside of the piezoelectric pump 2 is promoted.

With the series of states depicted in FIG. 8A to FIG. 8D repeated at high speeds in accordance with the vibration period of the piezoelectric element 10, the flows of F1 to F4 depicted in FIG. 3 occur as average flows inside the piezoelectric pump 2.

As depicted in FIG. 8A to FIG. 8D, a vibration node 48 is present in the vibrating part 26. The vibration node 48 is a location which is not displaced even if the vibrating part 26 vibrates. By contrast, the outer circumferential edge 27 of the vibrating part 26 is positioned at a position shifted from the vibration node 48. According to this arrangement, the outer circumferential edge 27 of the vibrating part 26 can be reliably caused to vibrate, and thus the vibration of the vibrating part 26 can be suppressed from being excessively transferred via the connecting parts 30 to the frame parts 28 and the side walls 12 and 14. This can suppress the leakage of the vibration of the piezoelectric element 10 and the vibrating part 26.

According to the above-described piezoelectric pump 2 of the first embodiment, the first valve 16 is provided, as depicted in FIG. 5A, as spaced from the first opening 20 in a planar view, and the second valve 18 is provided, as depicted in FIG. 5B, as spaced from the second opening 22 in a planar view. According to this structure, since the first valve 16 and the second valve 18 are respectively arranged away from the first opening 20 and the second opening 22, the valves 16 and 18 are designed not to collide with the edges of the openings 20 and 22, respectively, suppressing the damages on the valves 16 and 18. This can extend the life of the valves 16 and 18 and improve the reliability of the piezoelectric pump 2.

Also, according to the piezoelectric pump 2 of the first embodiment, the first valve 16 includes the first fixed part 16A fixed to the first top plate 4 and the first movable part 16B extending from the first fixed part 16A. Also, the second valve 18 includes the second fixed part 18A fixed to the second top plate 6 and the second movable part 18B extending from the second fixed part 18A. According to this structure, with the valves 16 and 18 respectively fixed to the top plates 4 and 6, the vibration of the first fixed part 16A of the valve 16 and the second fixed part 18A of the valve 18 can be suppressed, compared with the case in which the valves 16 and 18 are fixed to the vibrating part 26. This suppresses excessive vibration losses, can obtain a large vibration displacement, and can obtain a high flow rate and pressure characteristics.

Also, according to the piezoelectric pump 2 of the first embodiment, the first movable part 16B of the first valve 16 is arranged on an inner side portion of the first fixed part 16A of the first valve 16 in a planar view. Similarly, the second movable part 18B of the second valve 18 is arranged on an inner side portion of the second fixed part 18A of the second valve 18 in a planar view. According to this structure, the flows from the first opening 20 and the second opening 22 via the third openings 23 toward the fourth openings 24 can be suppressed, and the flows F1, F2, F3, and F4 from the fourth openings 24 via the third openings 23 toward the first opening 20 or the second opening 22 can be promoted.

Also, according to the piezoelectric pump 2 of the first embodiment, the vibrating part 26, the frame parts 28, and the connecting parts 30 are integrally configured. According to this structure, compared with a case in which the diaphragm 8 is configured of a plurality of members, the vibration of the vibrating part 26 is difficult to be transferred via the connecting parts 30 to the frame parts 28. This can suppress the leakage of the vibration of the piezoelectric element 10.

Also, according to the piezoelectric pump 2 of the first embodiment, the first opening 20 and the second opening 22 are respectively arranged at the center of the first pump chamber 32 and the second pump chamber 34 in a planar view. According to this structure, with the first opening 20 and the second opening 22 each positioned at a portion with large pressure fluctuations, high pressure characteristics can be obtained. Also, since air can be discharged from the portion with large pressure fluctuations, the flow velocity of the discharged air can be increased.

Modification Example

In the first embodiment, the example is described in which the vibrating part 26, the frame parts 28, and the connecting parts 30 configuring the diaphragm 8 are integrally formed. However, this is not meant to be restrictive. An example in which the diaphragm 8 is configured of a plurality of members is described by using FIG. 9.

Figure 9:
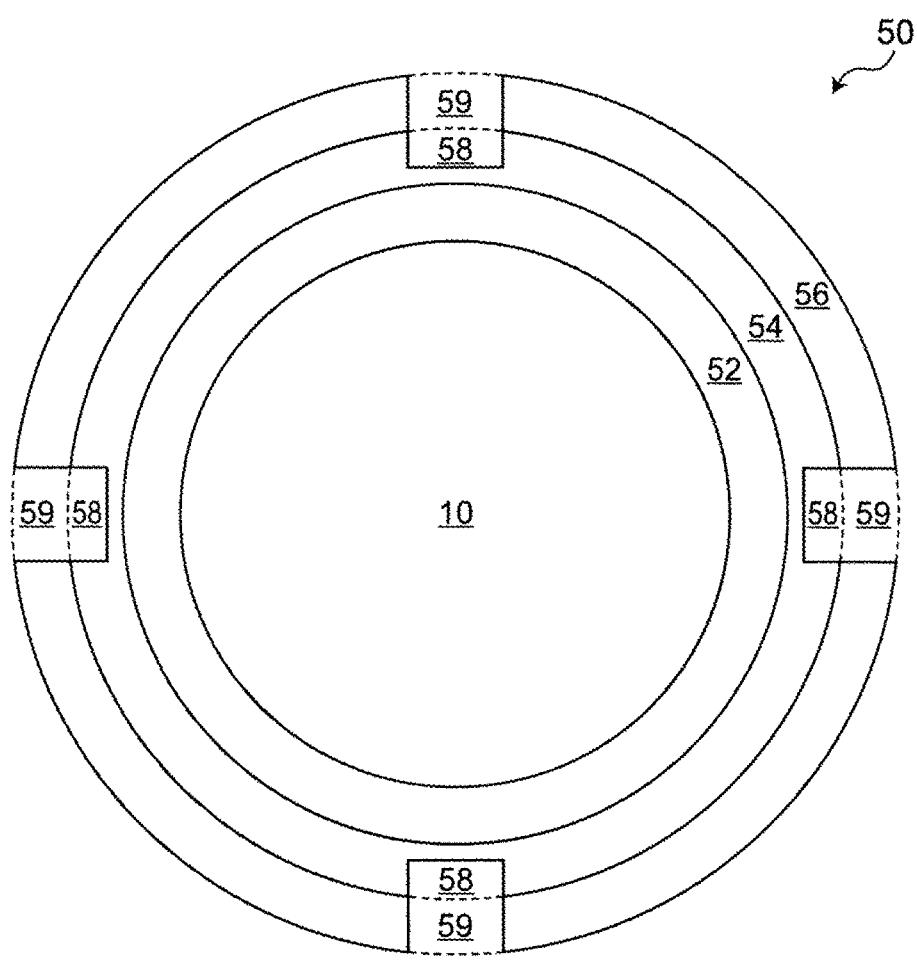
FIG. 9 is a plan view depicting a diaphragm in a modification example of the first embodiment.

FIG. 9 is a plan view depicting a diaphragm 50 in a modification example. The diaphragm 50 depicted in FIG. 9 includes a vibrating part 52 to which the piezoelectric element 10 is attached, a connecting part 54, and a frame part 56. The vibrating part 52, the connecting part 54, and the frame part 56 are all separate bodies.

The vibrating part 52, the connecting part 54, and the frame part 56 are all substantially disc-shaped members laminated sequentially from above. The piezoelectric element 10 is mounted on the vibrating part 52, the vibrating part 52 is mounted on the connecting part 54, and the connecting part 54 is mounted on the frame part 56. The vibrating part 52, the connecting part 54, and the frame part 56 are all arranged concentrically with the piezoelectric element 10.

As depicted in FIG. 9, the outer circumferential part of the connecting part 54 is partially cut away, and a plurality of third openings 58 are formed. Similarly, the outer circumferential part of the frame part 56 is partially cut away, and a plurality of fourth openings 59 are formed. Each of the third openings 58 and each of the fourth openings 59 mutually communicate. As described above, the third openings 58 are openings which let the first pump chamber 32 and the second pump chamber 34 mutually communicate, and the fourth openings 59 are openings which communicate with outside of the piezoelectric pump 2. Thus, from the fourth openings 59 via the third openings 58, air can be suctioned to the inside of the piezoelectric pump 2.

By forming the vibrating part 52, the connecting part 54, and the frame part 56 configuring the diaphragm 50 as separate bodies, the diaphragm 50 can be made of materials of a plurality of types, and the material and shape selectivity can be expanded.

According to the present modification example, the connecting part 54 may be configured of a material with an elastic modulus lower than the vibrating part 52. According to this structure, the vibration of the vibrating part 52 is difficult to be transferred via the connecting part 54 to the frame part 56, and the leakage of the vibration can be reduced. In this case, the connecting part 54 may be formed of a resin film such as polyimide, PET, or PPS, and the vibrating part 52 may be formed of a metal material such as stainless steel or aluminum.

In the present modification example, furthermore, the thickness of the connecting part 54 may be thinner than the thickness of the vibrating part 52. According to this structure, the vibration of the vibrating part 52 is difficult to be transferred via the connecting part 54 to the frame part 56, and the leakage of the vibration can be further reduced. In this case, the connecting part 54 may be formed of a metal foil having a thickness on the order of 0.01 to 0.2 mm, and the vibrating part 52 may be formed of a metal plate having a thickness on the order of 0.3 to 0.5 mm.

(Regarding Second to Fourth Embodiments)

Piezoelectric pumps of second to fourth embodiments according to the present disclosure are described. In the second to fourth embodiments, points different from the first embodiment are mainly described. Also, the description overlapping the first embodiment is omitted.

Figure 10:
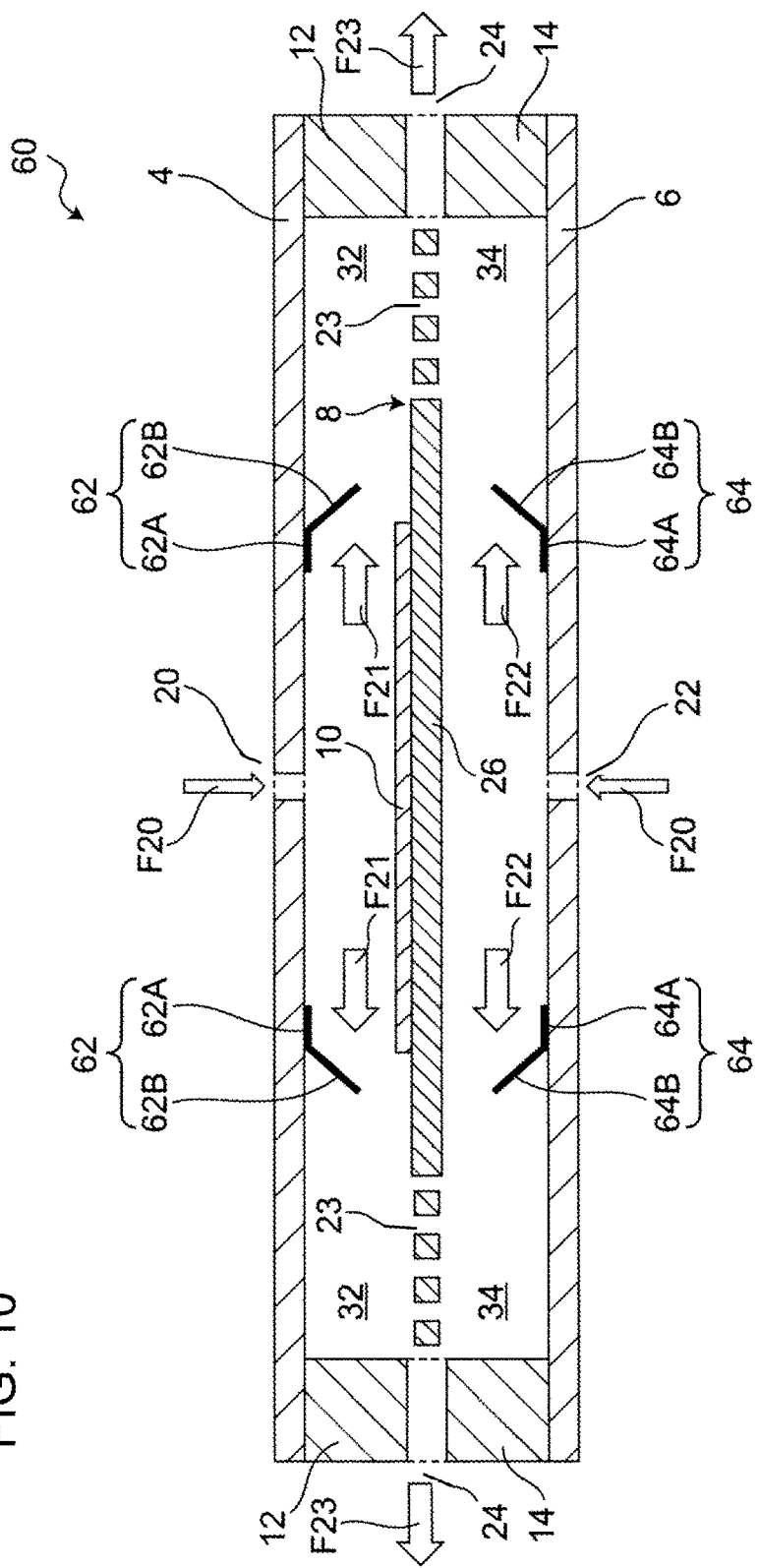
FIG. 10 is a sectional view depicting a schematic structure of a piezoelectric pump in a second embodiment.
Figure 11:
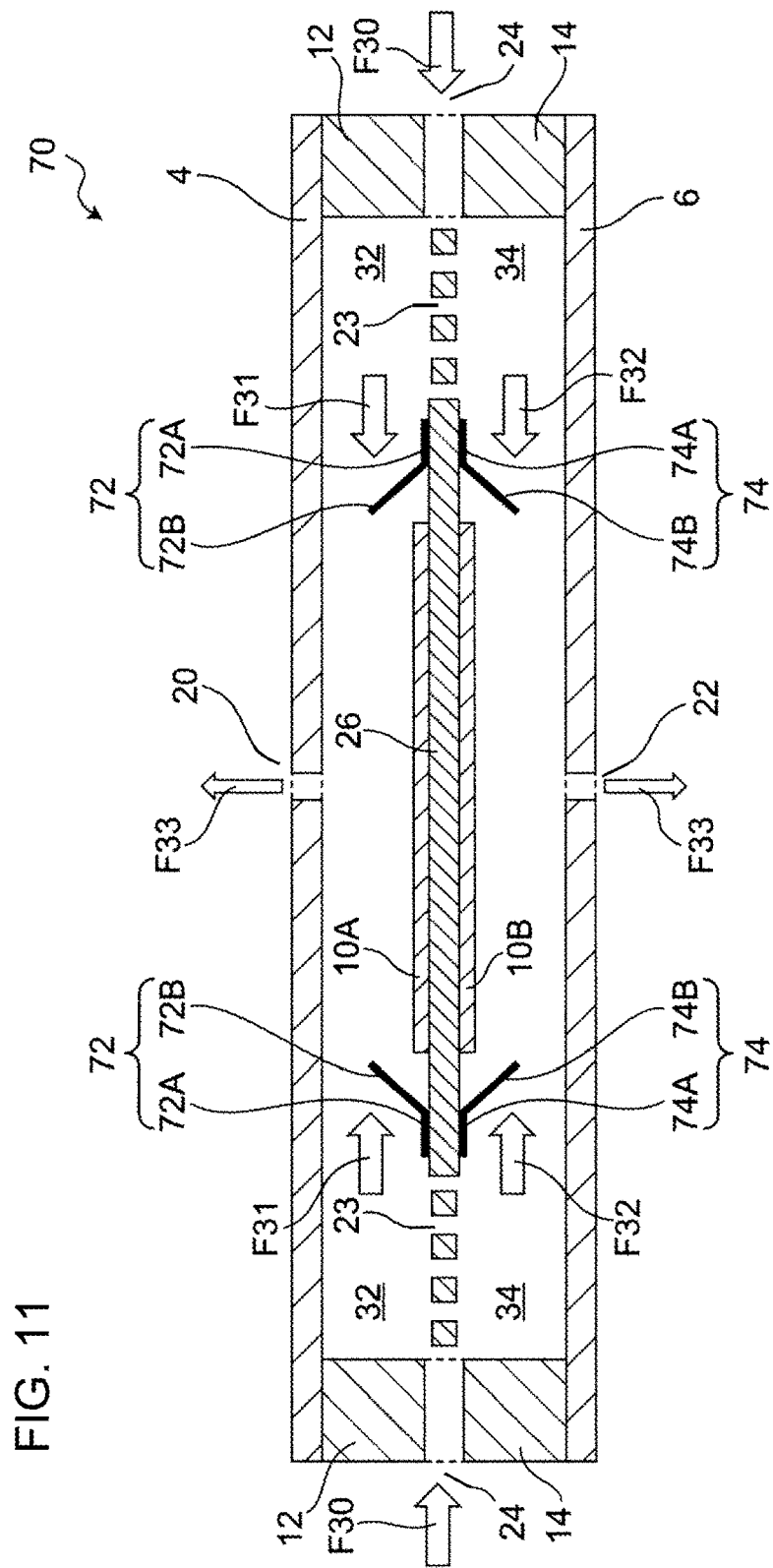
FIG. 11 is a sectional view depicting a schematic structure of a piezoelectric pump in a third embodiment.
Figure 12:
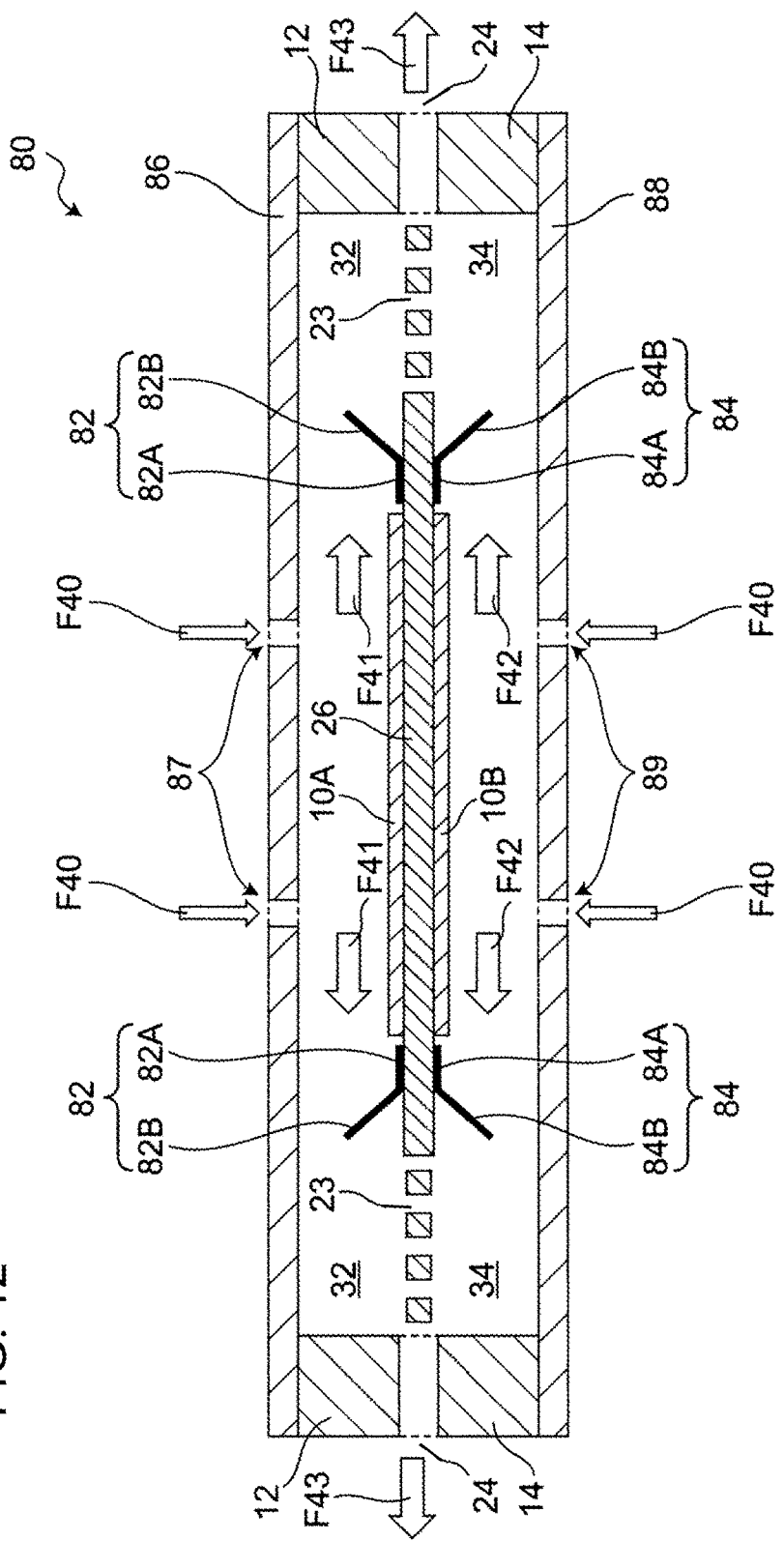
FIG. 12 is a sectional view depicting a schematic structure of a piezoelectric pump in a fourth embodiment.

FIG. 10 is a longitudinal sectional view depicting a schematic structure of a piezoelectric pump 60 of the second embodiment. FIG. 11 is a longitudinal sectional view depicting a schematic structure of a piezoelectric pump 70 of the third embodiment. FIG. 12 is a longitudinal sectional view depicting a schematic structure of a piezoelectric pump 80 of the fourth embodiment.

In the second to fourth embodiments, the position of the first valve provided in the first pump chamber 32 and the position of the second valve provided in the second pump chamber 34 are mainly different from those in the first embodiment.

Second Embodiment

As depicted in FIG. 10, the piezoelectric pump 60 of the second embodiment includes a first valve 62 and a second valve 64. As with the first embodiment, the first valve 62 is fixed to the first top plate 4, and the second valve 64 is fixed to the second top plate 6. However, a positional relation between a fixed part and a movable part in the valve 62, 64 is different.

Specifically, the first valve 62 includes a first fixed part 62A and a first movable part 62B, and the first movable part 62B is arranged on an outer side portion of the first fixed part 62A in a planar view. Similarly, the second valve 64 includes a second fixed part 64A and a second movable part 64B, and the second movable part 64B is arranged on an outer side portion of the second fixed part 64A in a planar view. According to this structure, as indicated by arrows F20, F21, F22, and F23, the piezoelectric pump 60 functions as a pump which continuously causes flows from the first opening 20 and the second opening 22 via the third openings 23 toward the fourth openings 24.

Third Embodiment

As depicted in FIG. 11, the piezoelectric pump 70 of the third embodiment includes a first valve 72 and a second valve 74. Unlike the first embodiment, the first valve 72 and the second valve 74 are both fixed to the vibrating part 26 of the diaphragm 8. Furthermore, in the piezoelectric pump 70 of the third embodiment, piezoelectric elements 10A and 10B are affixed to both sides, that is, the front surface and the back surface, of the vibrating part 26.

As depicted in FIG. 11, the first valve 72 is fixed to the front surface of the vibrating part 26, and the second valve 74 is fixed to the back surface of the vibrating part 26. In the vibrating part 26, the first valve 72 is mounted in an area of the front surface where the piezoelectric element 10A is not attached and the second valve 74 is mounted in an area of the back surface where the piezoelectric element 10B is not attached.

As depicted in FIG. 11, the first valve 72 includes a first fixed part 72A and a first movable part 72B, and the first movable part 72B is arranged on an inner side portion of the first fixed part 72A in a planar view. Similarly, the second valve 74 includes a second fixed part 74A and a second movable part 74B, and the second movable part 74B is arranged on an inner side portion of the second fixed part 74A in a planar view. According to this structure, as indicated by arrows F30, F31, F32, and F33, the piezoelectric pump 70 functions as a pump which continuously causes flows from the fourth openings 24 via the third openings 23 toward the first opening 20 and the second opening 22.

With the valves 72 and 74 fixed to the vibrating part 26 in this manner, flow-path resistance near the top plates 4 and 6 in the inner space of the piezoelectric pump 70 can be reduced, and a high flow rate can be obtained.

Also, with two piezoelectric elements 10A and 10B provided, displacement of the piezoelectric elements 10A and 10B is increased compared with a case in which only one is provided, enhancing the characteristics. Also, with the piezoelectric elements 10A and 10B and the vibrating part 26 being a vertically symmetric shape, warping of the diaphragm 8 is difficult to occur even if temperature changes, stabilizing the characteristics.

Fourth Embodiment

As depicted in FIG. 12, the piezoelectric pump 80 of the fourth embodiment includes a first valve 82 and a second valve 84. As with third embodiment, the first valve 82 and the second valve 84 are fixed to the vibrating part 26 of the diaphragm 8, but a positional relation between the fixed part and the movable part in the valve 82, 84 is different from that of the third embodiment. As a further different point, the shape of first openings 87 formed in a first top plate 86 and the shape of second openings 89 formed in a second top plate 88 are also different.

As depicted in FIG. 12, the first valve 82 includes a first fixed part 82A and a first movable part 82B, and the first movable part 82B is arranged on an outer side portion of the first fixed part 82A in a planar view. Similarly, the second valve 84 includes a second fixed part 84A and a second movable part 84B, and the second movable part 84B is arranged on an outer side portion of the second fixed part 84A in a planar view. According to this structure, as indicated by arrows F40, F41, F42, and F43, the piezoelectric pump 80 functions as a pump which continuously causes flows from the first openings 87 and the second openings 89 via the third openings 23 toward the fourth openings 24.

Figure 13A:
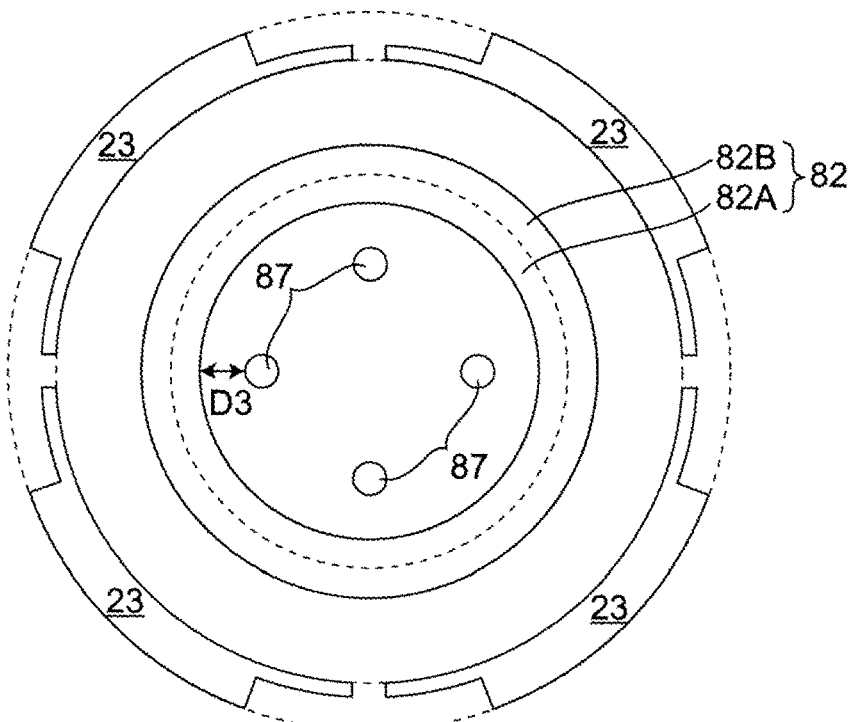
FIG. 13A is a plan view depicting a positional relation among first openings, a first valve, and third openings when the piezoelectric pump in the fourth embodiment is viewed in a planar view.
Figure 13B:
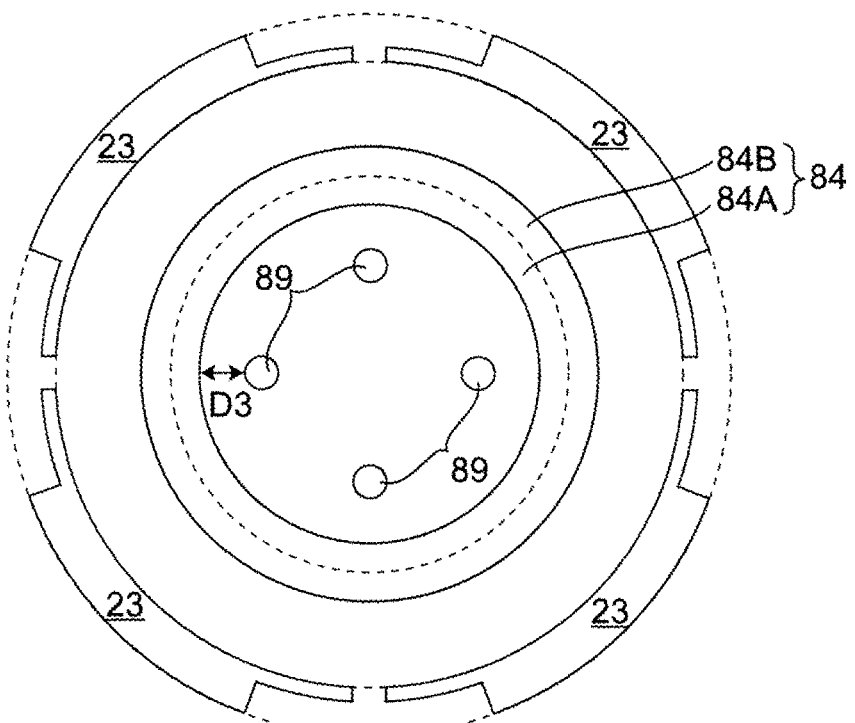
FIG. 13B is a plan view depicting a positional relation among second openings, a second valve, and the third openings when the piezoelectric pump in the fourth embodiment is viewed in a planar view.

Here, a relation between the valves 82 and 84 and the openings 87 and 89 in the piezoelectric pump 80 of the fourth embodiment is described by using FIG. 13A and FIG. 13B.

FIG. 13A is a plan view depicting a positional relation among the first openings 87, the first valve 82, and the third openings 23 when the piezoelectric pump 80 is viewed in a planar view. FIG. 13B is a plan view depicting a positional relation among the second openings 89, the second valve 84, and the third openings 23 when the piezoelectric pump 80 is viewed in a planar view.

As depicted in FIG. 13A, the first openings 87 are provided as distributed at a plurality of locations. The plurality of first openings 87 are circumferentially arranged in a planar view. The plurality of first openings 87 are each arranged on an inner side portion of the first valve 82. The first valve 82 arranged on an outer side portion of the first openings 87 is annularly provided so as to surround the first openings 87 with a distance D3 from the first openings 87.

As depicted in FIG. 13B, the second openings 89 are provided also at a plurality of locations. The plurality of second openings 89 are circumferentially arranged in a planar view. The plurality of second openings 89 are each arranged on an inner side portion of the second valve 84. The second valve 84 is annularly provided so as to surround the second openings 89 with the distance D3 from the second openings 89.

In this manner, with the distance D3 provided between the first valve 82 and the first openings 87 and the distance D3 provided between the second valve 84 and the second openings 89 in a planar view, the valves 82 and 84 can be each designed not to collide with the edge of the openings 87 and 89, respectively. This can suppress the damages on the valves 82 and 84, extend the life of the valves 82 and 84, and improve the reliability of the piezoelectric pump 80.

With the first openings 87 and the second openings 89 formed of a plurality of openings, flow-path resistance at each opening is decreased, and a high flow rate can be obtained.

While the present disclosure has been described above by citing the above-described first to fourth embodiments, the present disclosure is not limited to the above-described first to fourth embodiments.

While the present disclosure has been sufficiently described in relation to the preferred embodiments with reference to the accompanying drawings, various modifications and revisions are evident for those skilled in the art. These modifications and revisions should be construed as being included in the scope of the present disclosure based on the attached claims in a range not deviating from that range. Also, a combination or a change in sequence of the components in each embodiment can be achieved without deviating from the scope and idea of the present disclosure.

The present disclosure is useful for a piezoelectric pump using a piezoelectric element.

2 piezoelectric pump
4 first top plate
6 second top plate
8 diaphragm
10 piezoelectric element
12 first side wall
14 second side wall
16 first valve
16A fixed part
16B movable part
18 second valve
18A fixed part
18B movable part
20 first opening
22 second opening
23 third opening
24 fourth opening
26 vibrating part
27 outer circumferential edge
28 frame part
30 connecting part
30A first connecting part
30B second connecting part
30C third connecting part
32 first pump chamber
34 second pump chamber
36 wire
38 first electrode
40 second electrode 42 insulating area
44 first wire
46 second wire
48 vibration node
50 diaphragm
52 vibrating part
54 connecting part
56 frame part
58 third opening
59 fourth opening
60 piezoelectric pump
62 first valve
62A first fixed part
62B first movable part
64 second valve
64A second fixed part
64B second movable part
70 piezoelectric pump
72 first valve
72A first fixed part
72B first movable part
74 second valve
74A second fixed part
74B second movable part
80 piezoelectric pump
82 first valve
82A first fixed part
82B first movable part
84 second valve
84A second fixed part
84B second movable part
86 first top plate
87 first opening
88 second top plate
89 second opening
D1 to D3 distance
F1 to F18 flow
F20 to F23 flow
F30 to F33 flow
F40 to F43 flow
R1 component on one side
R2 component on the other side

The invention claimed is:

1. A piezoelectric pump comprising:
a first top plate having a first opening;
a second top plate arranged as spaced from the first top plate and having a second opening;
a diaphragm arranged between the first top plate and the second top plate and having a piezoelectric element attached thereto;
a first side wall coupling the first top plate and the diaphragm together and defining a first pump chamber between the first top plate and the diaphragm; and
a second side wall coupling the second top plate and the diaphragm together and defining a second pump chamber between the second top plate and the diaphragm, wherein
the diaphragm has a vibrating part having the piezoelectric element attached thereto, a frame part enclosed between the first side wall and the second side wall, and a connecting part connecting the vibrating part and the frame part,
the connecting part defines a third opening, and the third opening communicates the first pump chamber with the second pump chamber, the frame part has a fourth opening, and the fourth opening communicates with the third opening and also communicates with outside, and
the piezoelectric pump further includes
in the first pump chamber, an annular first valve provided as spaced from the first opening in in a planar view from a main surface of the first top plate toward a main surface of the second top plate so as to surround the first opening, and
in the second pump chamber, an annular second valve provided as spaced from the second opening in the planar view from a main surface of the first top plate toward a main surface of the second top plate so as to surround the second opening.

2. The piezoelectric pump according to claim 1, wherein
the first valve includes a first fixed part fixed to the first top plate and a first movable part extending from the first fixed part, and
the second valve includes a second fixed part fixed to the second top plate and a second movable part extending from the second fixed part.

3. The piezoelectric pump according to claim 1, wherein
the first valve includes a first fixed part fixed to the vibrating part and a first movable part extending from the first fixed part, and
the second valve includes a second fixed part fixed to the vibrating part and a second movable part extending from the second fixed part.

4. The piezoelectric pump according to claim 2, wherein
the first movable part of the first valve is arranged on an inner side portion of the first fixed part of the first valve in the planar view from a main surface of the first top plate toward a main surface of the second top plate, and
the second movable part of the second valve is arranged on an inner side portion of the second fixed part of the second valve in the planar view from a main surface of the first top plate toward a main surface of the second top plate.

5. The piezoelectric pump according to claim 2, wherein
the first movable part of the first valve is arranged on an outer side portion of the first fixed part of the first valve in the planar view from a main surface of the first top plate toward a main surface of the second top plate, and
the second movable part of the second valve is arranged on an outer side portion of the second fixed part of the second valve in the planar view from a main surface of the first top plate toward a main surface of the second top plate.

6. The piezoelectric pump according to claim 1, wherein
the vibrating part has an outer circumferential edge arranged at a position shifted from a position serving as a vibration node of the vibrating part.

7. The piezoelectric pump according to claim 1, wherein
the vibrating part, the connecting part, and the frame part are integrally configured.

8. The piezoelectric pump according to claim 1, wherein
the vibrating part and the connecting part are configured of separate bodies, and the connecting part is configured of a material with an elastic modulus lower than the vibrating part.

9. The piezoelectric pump according to claim 8, wherein
the connecting part is thinner than the vibrating part.

10. The piezoelectric pump according to claim 1, wherein
the connecting part has a first connecting part extending outward from the outer circumferential edge of the vibrating part, a second connecting part extending from the first connecting part along the outer circumferential edge of the vibrating part, and a third connecting part extending from the second connecting part so as to be connected to the frame part.

11. The piezoelectric pump according to claim 3, wherein the first movable part of the first valve is arranged on an inner side portion of the first fixed part of the first valve in the planar view from a main surface of the first top plate toward a main surface of the second top plate, and the second movable part of the second valve is arranged on an inner side portion of the second fixed part of the second valve in the planar view from a main surface of the first top plate toward a main surface of the second top plate.

12. The piezoelectric pump according to claim 3, wherein the first movable part of the first valve is arranged on an outer side portion of the first fixed part of the first valve in the planar view from a main surface of the first top plate toward a main surface of the second top plate, and the second movable part of the second valve is arranged on an outer side portion of the second fixed part of the second valve in the planar view from a main surface of the first top plate toward a main surface of the second top plate.

13. The piezoelectric pump according to claim 2, wherein the vibrating part has an outer circumferential edge arranged at a position shifted from a position serving as a vibration node of the vibrating part.

14. The piezoelectric pump according to claim 3, wherein the vibrating part has an outer circumferential edge arranged at a position shifted from a position serving as a vibration node of the vibrating part.

15. The piezoelectric pump according to claim 4, wherein the vibrating part has an outer circumferential edge arranged at a position shifted from a position serving as a vibration node of the vibrating part.

16. The piezoelectric pump according to claim 5, wherein the vibrating part has an outer circumferential edge arranged at a position shifted from a position serving as a vibration node of the vibrating part.

17. The piezoelectric pump according to claim 2, wherein the vibrating part, the connecting part, and the frame part are integrally configured.

18. The piezoelectric pump according to claim 3, wherein the vibrating part, the connecting part, and the frame part are integrally configured.

19. The piezoelectric pump according to claim 4, wherein the vibrating part, the connecting part, and the frame part are integrally configured.

20. The piezoelectric pump according to claim 5, wherein the vibrating part, the connecting part, and the frame part are integrally configured.

* * * * *